United States Patent
Matthews

(10) Patent No.: US 9,386,714 B2
(45) Date of Patent: Jul. 5, 2016

(54) APPARATUS FOR HOUSING AN ELECTRONIC COMPONENT, A METHOD

(71) Applicant: Nokia Corporation, Espoo (FI)

(72) Inventor: Andrew Peter Matthews, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 226 days.

(21) Appl. No.: 13/705,590

(22) Filed: Dec. 5, 2012

(65) Prior Publication Data

US 2014/0153161 A1    Jun. 5, 2014

(51) Int. Cl.
    *H05K 5/06*      (2006.01)

(52) U.S. Cl.
    CPC ............. *H05K 5/069* (2013.01); *H05K 5/06* (2013.01); *H05K 5/068* (2013.01); *Y10T 29/49* (2015.01)

(58) Field of Classification Search
    USPC ............................................ 174/73; 138/118
    See application file for complete search history.

(56) References Cited

U.S. PATENT DOCUMENTS

| | | | | |
|---|---|---|---|---|
| 738,894 | A * | 9/1903 | Shotey et al. | 460/142 |
| 3,948,178 | A * | 4/1976 | Luther | F42B 5/26 102/464 |
| 5,527,989 | A * | 6/1996 | Leeb | H05K 9/0043 174/378 |
| 6,297,448 | B1 | 10/2001 | Hara | 174/52.3 |
| 6,785,144 | B1 * | 8/2004 | Akram | H01L 23/5387 257/686 |
| 7,381,894 | B1 * | 6/2008 | Shotey | H02G 3/14 174/66 |
| 7,407,423 | B2 | 8/2008 | Aitken et al. | 445/25 |
| 7,786,559 | B2 | 8/2010 | Bayne et al. | 257/678 |
| 7,948,178 | B2 * | 5/2011 | Cok | 313/512 |
| 8,198,807 | B2 * | 6/2012 | Nguyen | H01L 51/5237 313/512 |
| 2001/0017212 | A1 | 8/2001 | Hirano | 174/17 |
| 2002/0034355 | A1 * | 3/2002 | Hagelin | G02B 6/3512 385/17 |
| 2010/0294024 | A1 | 11/2010 | Kumar et al. | 73/38 |

FOREIGN PATENT DOCUMENTS

| | | | | |
|---|---|---|---|---|
| EP | 0966188 | A2 | 12/1999 | |
| EP | 0966188 | A2 * | 6/2009 | H05K 5/06 |
| EP | 0966188 | A2 * | 6/2009 | H05K 5/06 |

OTHER PUBLICATIONS

"Infinite Power Solutions granted key encapsulation patent", Aug. 29, 2012, 2 pgs.

Suen, Chiyi-Shan, Chu, Xi; "Multilayer thin film barrier for protection of flex-electronics", Solid State Technology; Mar. 2008, vol. 51 Issue 3, p. 36.

\* cited by examiner

*Primary Examiner* — William H Mayo, III
*Assistant Examiner* — Krystal Robinson
(74) *Attorney, Agent, or Firm* — Harrington & Smith

(57) ABSTRACT

An apparatus including: a deformable protective housing including circumscribing deformable barrier side walls defining a variable volume internal hermetic chamber for housing an electronic component in a protected atmosphere.

20 Claims, 6 Drawing Sheets

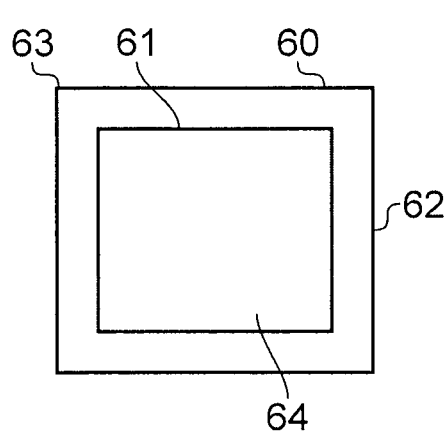
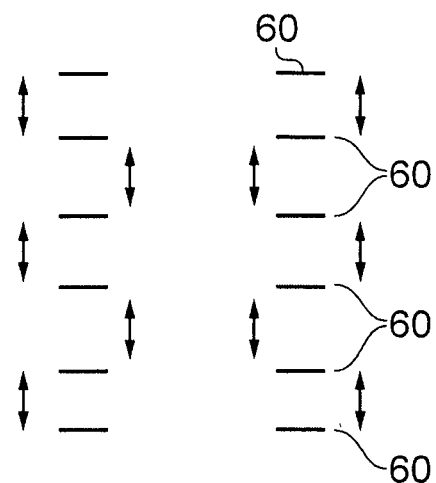
FIG. 7A   FIG. 7B
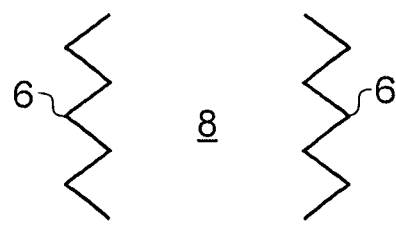
FIG. 7C
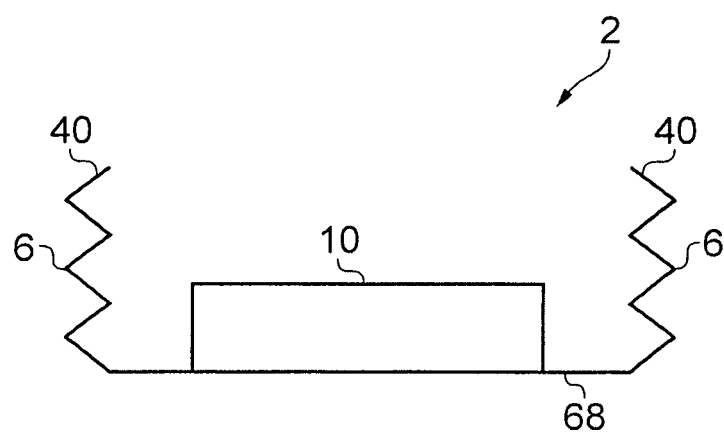
FIG. 8

APPARATUS FOR HOUSING AN ELECTRONIC COMPONENT, A METHOD

TECHNOLOGICAL FIELD

Embodiments of the present invention relate to an apparatus for housing an electronic component.

BACKGROUND

It may be desirable to house an electronic component so that it is protected from damage.

BRIEF SUMMARY

According to various, but not necessarily all, embodiments of the invention there is provided an apparatus comprising: a deformable protective housing comprising circumscribing deformable barrier side walls defining a variable volume internal hermetic chamber for housing an electronic component in a protected atmosphere.

This provides the advantage that the apparatus both deforms and protects the electronic component.

BRIEF DESCRIPTION

For a better understanding of various examples of embodiments of the present invention reference will now be made by way of example only to the accompanying drawings in which:

FIGS. 7A, 7B and 7C illustrate manufacture of side walls from sheets of material;

FIG. 8 illustrates an example of an apparatus where a portion of the electronic component is extended to form a portion of at least one barrier side wall;

DETAILED DESCRIPTION

Figure 1:
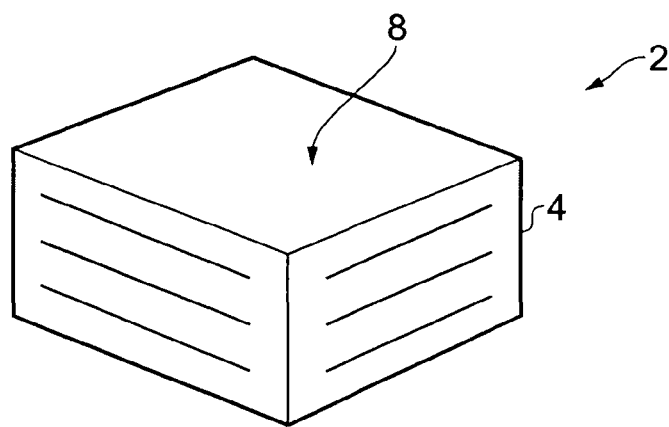
FIG. 1 is a perspective external view of an example of an apparatus that is used to protect an electronic component.

The Figures illustrate an apparatus 2 comprising: a deformable protective housing 4 comprising circumscribing deformable barrier side walls 6 defining a variable volume internal hermetic chamber 8 for housing an electronic component 10 in a protected atmosphere.

Figures 2A, 2B:
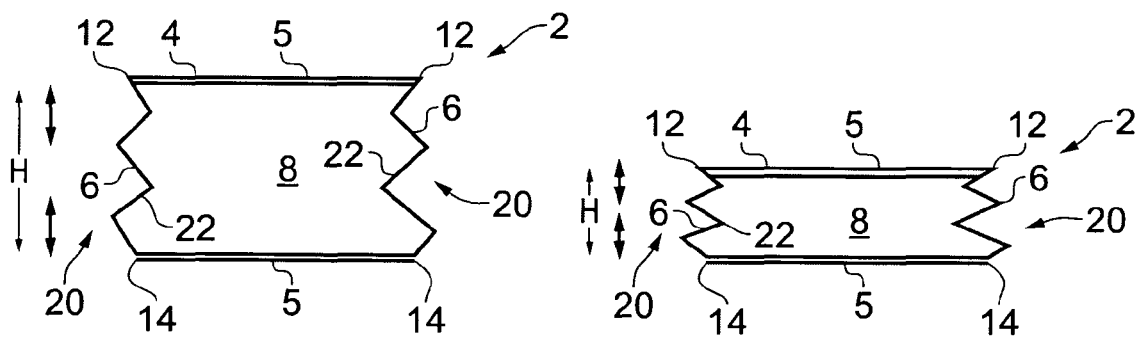
FIGS. 2A, 2B and 2C are cross-sectional side views of an example of an apparatus in an expanded configuration, a retracted configuration and a skewed configuration.
Figure 2C:
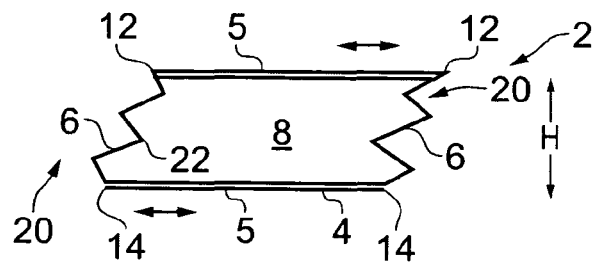

FIG. 1 is a perspective external view of an example of an apparatus 2 that is used to protect an electronic component. FIGS. 2A, 2B and 2C are cross-sectional side views of an example of an apparatus 2.

The apparatus 2 has an internal chamber 8 that is hermetic in use. It provides a controlled protective atmosphere for at least those portions of the electronic component that are within the internal chamber 8.

In some embodiments, the whole of the electronic component may be within the chamber 8. In other embodiments, a part of the electronic component may be inside the chamber 8 and a portion of the electronic component, for example a user input device or a user output device such as a display, may form a part of the chamber 8.

The internal chamber 8 has side walls 6 that form a barrier. The side walls 6 circumscribe and define the internal chamber 8. Circumscribe in this context does not imply a particular shape to a perimeter of the side walls and is used to connote that the walls 6 surround (enclose) the chamber 8 on four bounding sides that are defined relative to the same plane. The side walls 6 are barrier side walls because they provide an hermetic barrier that controls and protects the atmosphere within the chamber 8 when it is in use and hermetic.

The internal chamber 8 has a variable volume. The variable volume is provided by the carrier side walls 6 which are deformable in use. This deformation may be reversible.

FIG. 2A illustrates an expanded configuration, in which the deformable barrier side walls 6 have been expanded and the internal hermetic chamber 8 is also expanded. In this configuration, the deformable barrier side walls 6 and the internal hermetic chamber 8 may be further expanded or alternatively collapsed. They are reversibly collapsible/expandable.

FIG. 2B illustrates a retracted configuration, in which the deformable barrier side walls 6 have been partially collapsed and the internal hermetic chamber 8 is also partially collapsed. In this configuration, the deformable barrier side walls 6 and the internal hermetic chamber 8 may be further collapsed or alternatively expanded. They are reversibly collapsible/expandable.

FIG. 2C illustrates a skewed configuration, in which the deformable barrier side walls 6 have been skewed sideways so that they are rotated about their base and are no longer vertical. In this configuration, the deformable barrier side walls 6 may be returned to or towards vertical or further skewed towards the horizontal.

Referring to FIGS. 2A-2C, the chamber 8 has housing portions 5 separated by variable barrier side walls 6. The chamber 8 has a height H defined between tops 12 and bottoms 14 of the barrier side walls 6.

Variation in a barrier side wall 6 may be provided by at least one deformation zone 20 in that side wall.

The deformation zone 20 enables relative movement of portions of the barrier side wall 6 on either side of the deformation zone 20.

The deformation zone(s) 20 may, for example, be provided by offsetting some of the material in the barrier side walls 6 using lateral offsets 22. Each lateral offset defines a return. The side wall 6 returns or bends-over to create one of more folds.

In the example of FIGS. 2A, 2B and 2C a lateral offset 22 extends laterally (in an orthogonal direction to the direction of the offset 22) as fold. The lateral offsets (folds) are stacked height-wise. This creates a bellow-like arrangement, where the bellows expands and retracts in a height-wise direction (FIGS. 2A and 2B) and which allows some lateral skewing (FIG. 2C).

In this example, the barrier side walls 6 may have a fixed length of material between the tops 12 and bottoms 14 of the barrier side walls 6. The barrier side walls 6 have a variable height H between the tops 12 and bottoms 14 of the barrier side walls 6 by providing at least one deformation zone 20 in each side wall.

Figure 10:
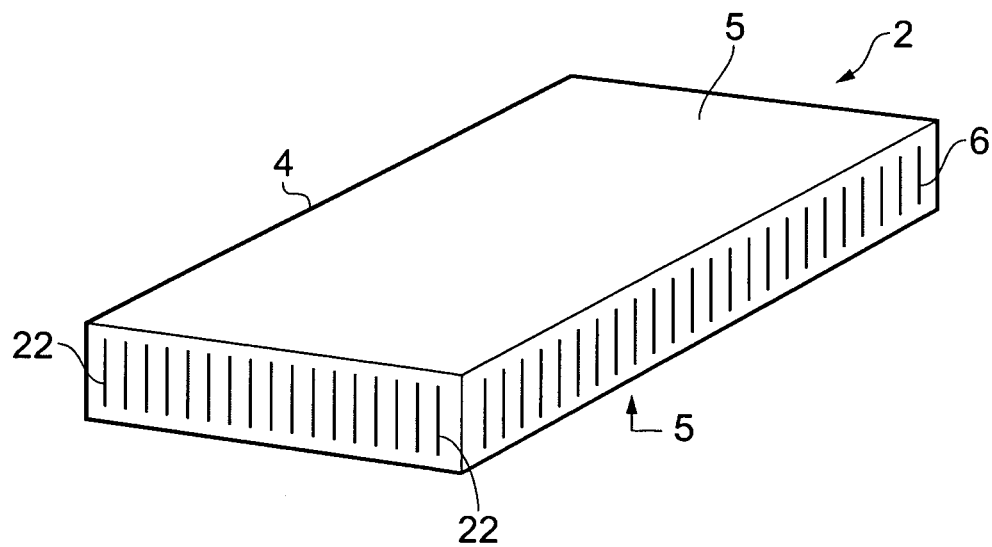
FIG. 10 illustrates an external side view of an example of an apparatus.

In an alternative example, illustrated in FIG. 10, the lateral offset 22 extends height-wise (in an orthogonal direction to the direction of offset provided by the lateral offset 22) as folds. The lateral offsets (folds) are stacked laterally. This creates a bellow-like arrangement, where the bellows expands and retracts in a lateral direction. In this example, the offsets extend height-wise in a direction orthogonal to surface of the portions 5 of the housing 4 that may be bent.

If one or both of the portions 5 of the housing 4 are stretchable as well as flexible, then when they are bent, the sidewalls 6 between the portions 5 at the extremities of the arc of bending may remain in alignment at approximately 90° to the surface of the portions 5. The sidewalls 6, between the portions 5, along the arc of bending will fan-out to accommodate the difference in arc length at the portion 5 on the exterior of the arc of bending and at the portion 5 in the interior of the arc of bending. This enables even distribution of strain.

If one or both of the portions 5 of the housing 4 are not stretchable as well as flexible, then when they are bent, the sidewalls 6 between the portions 5 at the extremities of the bending arc will not both remain in alignment at approximately 90° to the surface of the portions 5.

Figure 3A:
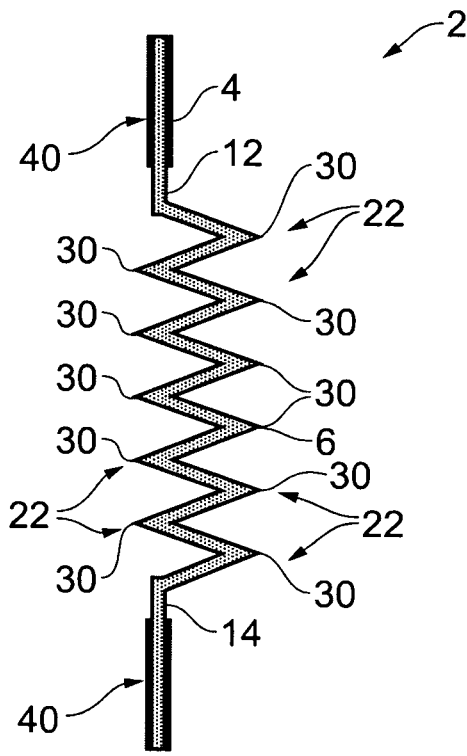
FIGS. 3A, 3B and 3C illustrate an example of an apparatus the barrier side wall is a folded barrier side wall and comprises multiple folds 30.
Figure 3B:
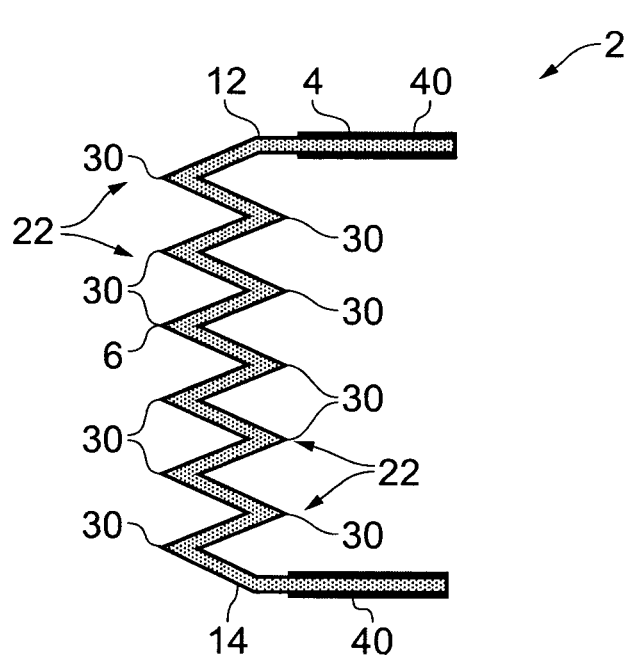
Figure 3C:
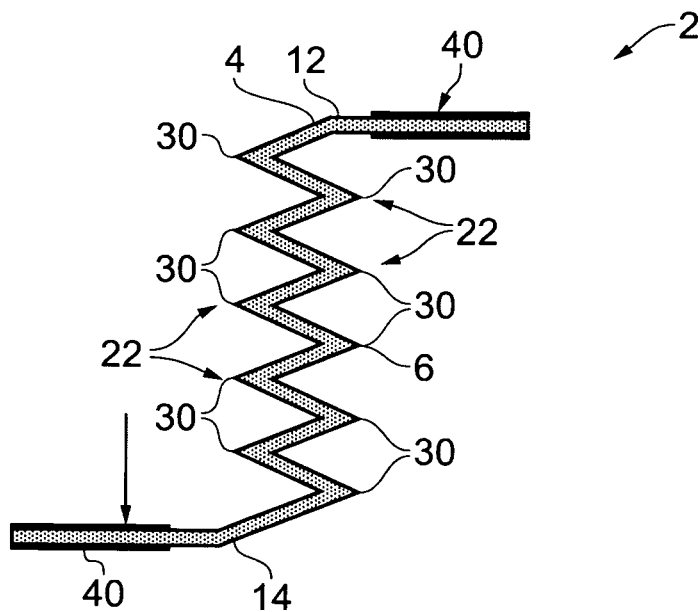

FIGS. 3A, 3B and 3C illustrate an example of an apparatus 2 where a (or each) barrier side wall 6 is a folded barrier side wall 6 and comprises multiple folds 30. Each fold 30 defines a relatively small lateral offset 22.

The folded barrier side wall 6 comprises a series of alternate furrows and ridges. In this example, the furrows and ridges are of the same magnitude and the folded side wall 6 is corrugated. Each furrow and ridge comprises a joint at its apex that enables relative rotational movement of the portions of the side wall that meet at that joint about the joint. Thus a pitch across the furrow or ridge is increased or decreased by changing the angle at which the portions of the side wall meet at the furrow or ridge.

The apparatus 2 thus forms miniature mechanical metal bellows.

In this example, each barrier side wall 6 comprises at a top 12 and/or a bottom 14 a fixture zone 40 for fixing the barrier side wall in position.

FIGS. 4A, 4B, 4C and 4D illustrate an example of an apparatus 2 where a (or each) barrier side wall 6 is a single-fold barrier side wall 6 and comprises a single fold 30. The single fold 30 defines a relatively large lateral offset 20.

Figure 4A:
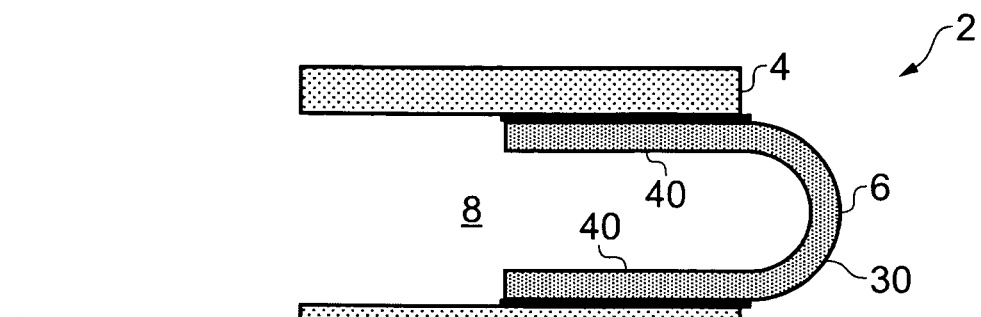
FIGS. 4A, 4B, 4C and 4D illustrate an example of an apparatus where the barrier side wall is a single-fold barrier side wall and comprises a single fold.
Figure 4B:
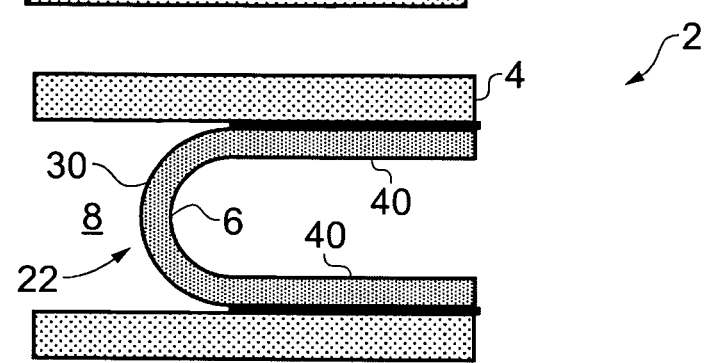

The single fold 30 may extend outwards away from the chamber 8 (FIGS. 4A, 4C, 4D) or inwards towards the chamber 8 (FIG. 4B).

In order to accommodate corner bends, if all the side walls 6 are made from a single strip of foil, it may be advantageous to have the fold 30 extend outwards at one edge, while extending inwards along the adjacent edges and vice versa.

Figure 4C:
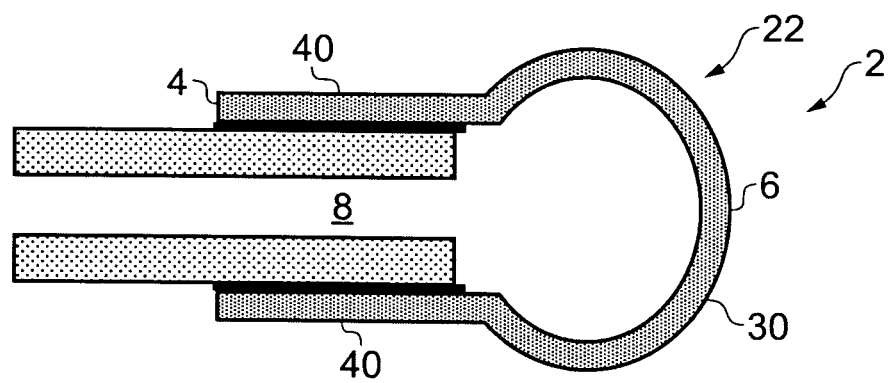
Figure 4D:
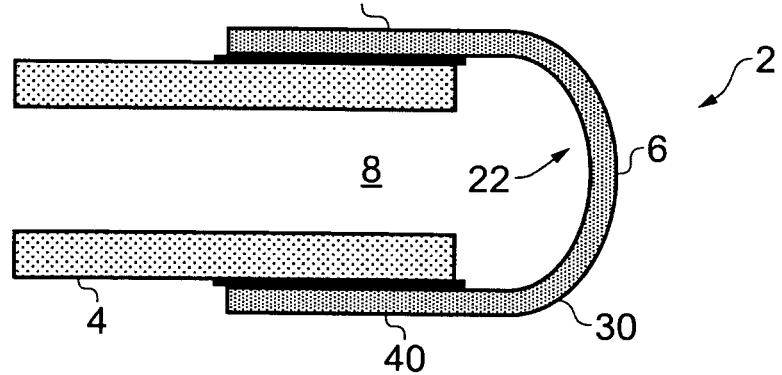

Fixture zone 40 of the side wall 6 may be positioned inside the chamber (FIG. 4A, 4B) or outside the chamber (FIG. 4C, 4D). In the Figures both the upper and lower fixture zones are either positioned within or outside the chamber 8, however, in other examples one of the upper and lower fixture zones may be positioned inside the chamber 8 and the other may be positioned outside the chamber 8.

The examples of side walls 6 illustrated in FIGS. 3A-3C and 4A-4D are merely illustrative.

Barrier side walls 6 may be formed from any suitable material. In some examples they are formed from metal, for example, metal foil.

Figure 6:
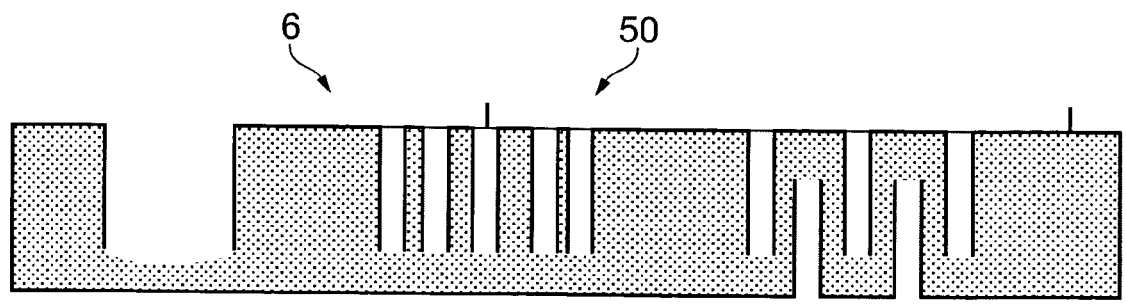
FIG. 6 illustrates an example of a barrier side wall comprising micro-machined surface features.

In some embodiments, one some or all barrier side walls 6 may comprise micro-machined surface features 50, for example, as illustrated in FIG. 6. Such features 50 may be formed by micro-indentation using a press tool with features of order millimeters to hundreds of nanometers to create folds or indentations in a metal foil over a required area. Other micro-machining options include laser machining, laser assisted chemical machining, chemical etching or water-jet erosion.

In some embodiments, for example, as illustrated in FIGS. 7A-7C, one some or all barrier side walls 6 may comprise sheets of material 60 that have been joined together, for example, by electron-beam welding.

FIG. 7A illustrated a sheet of metal 60 that has a perimeter strip of material 62 and within that a central aperture 64. The central aperture 64 will be used to form the chamber 8. The perimeter strip 62 will be used to form the side walls 6.

FIG. 7B illustrates how a stack of multiple sheets of metal 60 that each have a perimeter strip 62 of material and a central aperture 64 are joined together. Adjacent sheets 60 in the stack are joined together either by welding together the sheets at an internal edge 61 of the perimeter strip 62 or at an external edge 63 of the perimeter strip 62.

A sheet 60 in the stack is joined to an adjacent sheet by either welding at the internal edge 61 or at the external edge 63 (not both) and it is then joined to its other adjacent sheet in the stack (if any) at the other one of the internal and external edges. Thus the joins through the stack alternate internal edge/external edge, to form the folded barrier side wall 6 illustrated in FIG. 7C (similar to those illustrated in FIGS. 3A-3C).

FIG. 8 illustrates an example of an apparatus 2 where a portion 68 of the electronic component 10 is extended to form a portion of at least one barrier side wall 6. In this example, the side wall 6 is an integral part of a portion 62 of the electronic component 10. Integral in this sense means that the portion 62 extends as a single piece to form the side wall 6.

The portion 62 may, for example, be a metal foil used to form an electrode or substrate of the electronic component 10.

In this example, the side walls 6 have an upper fixture zone 40 but do not have a lower fixture zone.

In general, side walls 6 may be joined to another portion of the apparatus 2 or a portion of the electronic component 10 housed by the apparatus 2, at their fixture zones 40.

Any fixture zone 40 of any of the protective side walls 6 may, for example, be bonded directly to a portion of the electronic component, if the functioning of the electronic component 10 is not affected by the direct bonding. However, if the direct bonding could, for example, provide a current path, then the fixture zone 40 of the protective side walls 6 may, for example, be bonded indirectly to a portion of the electronic component 10. Indirect bonding may use an intermediate bonding material, for example an insulator, to connect the fixture zone 40 and the electronic component 10.

In some embodiments the apparatus 2 is a module configured to receive an electronic component 10. It is then sealed while housing the electronic component to protect the electronic component. In other embodiments the apparatus 2 is integrated with an electronic component 10, as a combined module. The combined module is then sealed to protect the electronic component 10.

Sealing may involves bonding the fixture zone 40 of the side walls 6 to an appropriate structure. It is desirable to use a process that maintains a bulk temperature of the electronic component below 100° C.

In some embodiments, a non-insulated seal may be used. Then the surfaces to be sealed can be joined directly using laser, electron beam or other welding techniques.

In some embodiments, an insulated seal may be used. For example, glass may be welded in-situ using electron beam or laser welding. A frit (laser assisted or otherwise) cold spray glass seal, or a combination of these may be used. The glass coverage can either extend only over the area of the fixture zone 40, or over the area of the entire side walls 6, in order to prevent electrical shorts. Cold spray glass seals, which can be laser assisted or not, have the advantage that the deposited glass films tend to be in a state of compression, and therefore less susceptible to fracture under strain. "Frit" glass, is supplied as small particles of ground glass which may be zirconia, alumina, silica, etc., of typical diameter 20~150 microns, that when heated to ~440 C create the seal. In order to dispense solder glass, the particles are mixed in a solvent (typically Amyl Acetate or Butyl Acetate) and binder (nitrocellulose). Whichever process is used to deposit a coating of glass on one or both of the surfaces that need to be joined, laser heating may be used to melt fuse the joint after assembly and create the hermetic seal without appreciable bulk heating.

If a frit or cold spray glass seal- is used then a thin film of glass, which may be zirconia, alumina, silica, etc., is deposited directly onto one or more of the surfaces by:

laser assisted cold spraying
conventional cold spraying
screen printing
ablating sintered glass targets using a pulsed laser or electron beam,
thermal evaporation,
physical vapour deposition.

For example, a spray nozzle may be used to deposit glass particles balistically. Using this process, glass particles of the desired stoichiometry and small size are sprayed through a nozzle at very high velocity and strike the surface. On striking the surface, the kinetic energy is converted to thermal energy, causing localized melting of the glass and good adhesion and low porosity. This melting process and reduction in porosity can be further enhanced by pulsed laser heating. In both circumstances the bulk heating is minimal. A further advantage of this manufacturing process is that the process can be carried out at room pressure, as the spray is facilitated using an inert gas which prevents oxidation and improves binding.

Using the alternative approaches, such as laser or e-beam ablation, thermal evaporation or physical vapor deposition requires the process to be undertaken under vacuum, and shadow masks are required to determine the edge profiles. Longer duration ablation can be used to alter deposited film thickness, and composite glass structures can be created by sequentially ablating different targets onto the same location. In these circumstances, it is likely that the glass is deposited on the bare foils before incorporation into the apparatus 2, allowing the higher temperature, high vacuum deposition processes to be used. These higher temperatures also can lead to compressive stresses within the glass once cooled. Furthermore, tension can also be applied to the foils during deposition to further enhance the film compressive stresses at room temperature.

An alternative method of creating the glass strip in the fixture zone 40 is to use thin glass fibre and bond it to the current collector surface using pulsed laser heating. Glass fibre is commonly available in long lengths of different diameters and differing compositions. Once the glass strip has been deposited, external heating by pulsed laser can be used to locally sinter the join and create a hermetic seal without causing bulk heating. The pulsed laser heating could be performed edge-on, or from the top and/or bottom.

Where laser heating is used, optically absorbing layers might be used to strongly absorb the laser energy, thereby increasing the local heating and minimizing the bulk heating.

Figure 5A:
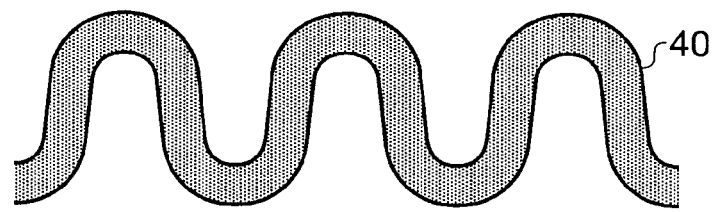
FIGS. 5A, 5B and 5C illustrate examples of fixture zones for a barrier side wall.
Figure 5B:
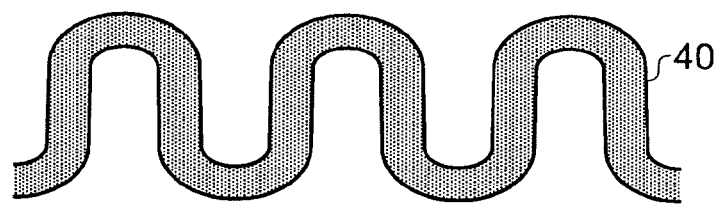
Figure 5C:
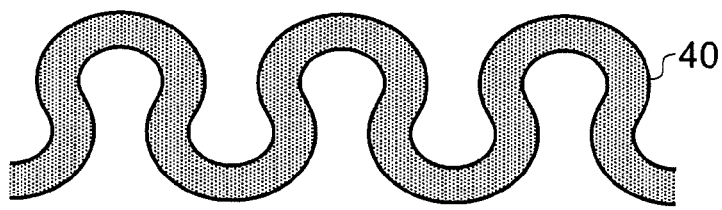

FIGS. 5A, 5B and 5C illustrate fixture zones 40 of the side walls. The fixture zones 40 are curved. In FIG. 5A, the fixture zone 40 has a undulating zig-zag shape. In FIG. 5B, the fixture zone 40 has a (repetitive) horse-shoe shape. In FIG. 5AC the fixture zone 40 has a (repetitive) bell-shape.

The electronic component 10 may be an electronic component that has been configured for user-flexing. That is it may be an electronic component that is designed to be repeatedly flexed by a user. Flexing may, for example involve bending in one axis, bending in two or more axes, twisting about one axis and/or twisting about more than one axis.

The electronic component 10 may be a component that is sensitive to atmospheric changes. It may, for example, be a component that is susceptible to damage from atmospheric oxygen. It may, for example, be a component that is susceptible to damage from humidity (water vapour).

The electronic component 10 may, for example, be an organic electronic component. An organic electronic component is an electronic component that uses organic molecules or polymers.

The electronic component 10 may, for example, be an organic light emitting diode (OLED) display. The display may be flexible (see above). An OLED display may be susceptible to damage from atmospheric oxygen and water. The long term performance of the organic materials used in OLED displays requires a Water Vapour Transmission Rate (WVTR) of less than 10-6 g/m2/day and oxygen transmission rate of less than 10-4 g/m2/day.

The electronic component 10 may, for example, be a battery, a touch panel or a solar (photovoltaic) panel.

Figure 9:
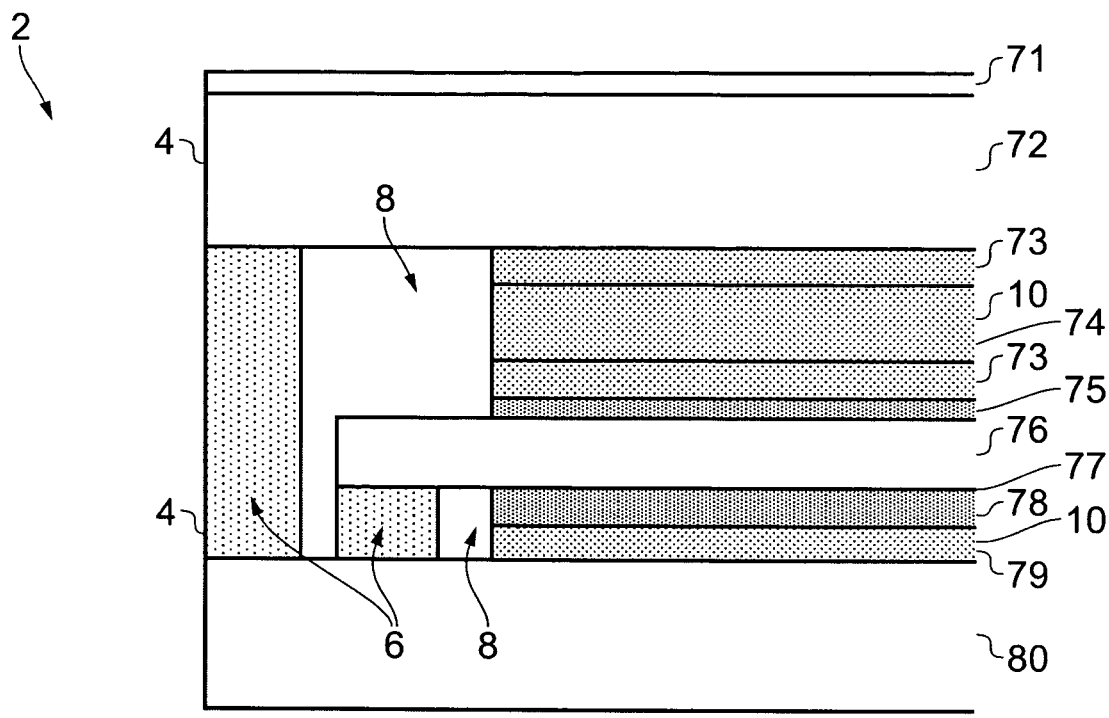
FIG. 9 illustrates the apparatus when it is hermetically sealing an electronic component.

In FIG. 9, the apparatus 2 is an hermetic internal housing module of an electronic component 10.

The hermetic internal housing module of an electronic component 10 comprises the electronic component 10 protected by a deformable protective housing 4 comprising circumscribing deformable barrier side walls 6 defining a variable volume internal hermetic chamber 8 for housing the electronic component 10 in a controlled protective atmosphere. The side walls 6 provide miniature flexible hermetic seals.

In more detail, the example apparatus 2 comprises: an anti-reflection coat 71, an underlying optical window 72, a layer of optically clear adhesive 73, a touch panel sensor 74, another layer of optically clear adhesive 73, a polarizer 75, an optically clear window 76, a cathode 77, an organic active layer 78, an array of thin film transistors 79 and a substrate 80. The cathode 77, an organic active layer 78, and the array of thin film transistors 79 form an active matrix OLED display.

The touch panel sensor 74 is in this example an electronic component 10 that may need protecting.

The organic active layer 78 is in this example an electronic component 10 that needs protecting Side walls 6 may be positioned between and bonded to the substrate 80 and the upper window 72 to form an hermetic edge seal that protects both the touch panel sensor 74 and the organic active layer 78. The substrate 80 operates as a lower barrier. It may, for example, be formed from glass or metal. The upper window 72 operates as an upper barrier. It may, for example, be formed from glass or plastic coated glass.

Side walls 6 may alternatively or additionally be positioned between and bonded to the substrate 80 and the lower window 76 to form an hermetic edge seal that protects the organic active layer 78 but not the touch panel sensor 74. The substrate 80 operates as a lower barrier. It may, for example, be formed from glass or metal. The lower window 76 operates as an upper barrier. It may, for example, be formed from glass or plastic coated glass.

The side walls 6 provide flexible hermetic edge seals that can be bonded at low temperatures compatible with organic electronics in displays, and liquid or polymer electrolytes and materials in batteries.

As used here 'module' refers to a unit or apparatus that excludes certain parts/components that would be added by an end manufacturer or a user.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
   a deformable protective housing comprising transparent window and circumscribing deformable barrier side walls defining a variable volume internal hermetic chamber configured to house an electronic component in a protected atmosphere.

2. An apparatus as claimed in claim 1, wherein each barrier side wall is reversibly collapsible and reversibly expandable.

3. An apparatus as claimed in claim 1, wherein each barrier aide wall comprises at least one deformation zone that enables relative movement of portions of the barrier side wall.

4. An apparatus as claimed in claim 3, wherein the deformation zone comprises a returning bend.

5. An apparatus as claimed in claim 1, wherein the barrier side walls comprise at least one lateral offset in a material of the barrier side walls.

6. An apparatus as claimed in claim 1, wherein each barrier side wall defines a folded barrier.

7. An apparatus as claimed in claim 1, wherein each barrier side wall comprises at least one fixture zone configured to fix the barrier side wall in position.

8. An apparatus as claimed in claim 7, wherein the fixture zone configured to fix the barrier side wall in position is curved.

9. An apparatus as claimed in claim 1, wherein each barrier side wall comprises micro-machined surface features.

10. An apparatus as claimed in claim 1, wherein the barrier side walls comprise sheets of material that have been joined together.

11. An apparatus as claimed in claim 1, wherein at least one portion of at least one barrier side wall is an integral extension of a portion of the electronic component.

12. An apparatus as claimed in claim 1, wherein the apparatus is a module configured to be sealed while housing the electronic component.

13. An apparatus as claimed in claim 1, wherein the apparatus houses the electronic component and the apparatus is sealed to protect the electronic component.

14. An apparatus as claimed in claim 13, wherein the protective side walls are bonded directly to a portion of the electronic component.

15. An apparatus as claimed in claim 13, wherein the protective side walls are bonded indirectly via an electrical insulator to a portion of the electronic component.

16. An apparatus as claimed in claim 1, wherein the electronic component is selected from the group comprising: a user-flexible component, an organic electronic component: a display, a battery, a touch panel, a solar panel, organic light emitting diode display.

17. An apparatus as claimed in claim 1, wherein the variable volume internal hermetic chamber further houses, inside the circumscribing deformable barrier side walls and within the first protected atmosphere, second circumscribing deformable barrier side walls defining a second, different, variable volume internal hermetic chamber configured to house a second electronic component in a second protected atmosphere, sealed from the first protected atmosphere.

18. An apparatus as claimed in claim 1, wherein the at least one barrier side wall is configured to allow lateral transformation of upper and lower surfaces of a multi-layer apparatus.

19. An hermetic internal housing module of an electronic component comprising: an electronic component and an apparatus comprising a deformable protective housing comprising a transparent window and circumscribing deformable barrier side walls defining a variable volume internal hermetic chamber configured to house an electronic component in a protected atmosphere, wherein at least portions of the electronic component are encapsulated with a protected atmosphere.

20. A method comprising:
   manufacturing deformable barrier side walls of a deformable protective housing comprising a transparent window, configured to house a electronic component in a controlled atmosphere.

* * * * *